(12) United States Patent
Kitagawa et al.

(10) Patent No.: US 9,650,724 B2
(45) Date of Patent: May 16, 2017

(54) METHOD OF CHARGING RAW MATERIAL, METHOD OF MANUFACTURING SINGLE CRYSTALS, AND SINGLE CRYSTAL MANUFACTURING APPARATUS

(71) Applicant: SHIN-ETSU HANDOTAI CO., LTD., Tokyo (JP)

(72) Inventors: Katsuyuki Kitagawa, Nishigo-mura (JP); Masahiko Urano, Nishigo-mura (JP); Katsuhiro Yoshida, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 274 days.

(21) Appl. No.: 14/428,745

(22) PCT Filed: Oct. 28, 2013

(86) PCT No.: PCT/JP2013/006344
§ 371 (c)(1),
(2) Date: Mar. 17, 2015

(87) PCT Pub. No.: WO2014/080573
PCT Pub. Date: May 30, 2014

(65) Prior Publication Data
US 2015/0233013 A1     Aug. 20, 2015

(30) Foreign Application Priority Data
Nov. 20, 2012   (JP) .................................. 2012-254568

(51) Int. Cl.
*C30B 15/02*          (2006.01)
(52) U.S. Cl.
CPC ......... *C30B 15/02* (2013.01); *Y10T 117/1056* (2015.01)

(58) Field of Classification Search
CPC ......... C30B 15/02; C30B 15/10; C30B 15/20; Y10T 117/1056
See application file for complete search history.

(56) References Cited

U.S. PATENT DOCUMENTS

| | | | | |
|---|---|---|---|---|
| 4,036,595 A | * | 7/1977 | Lorenzini | ............... C30B 15/02 117/202 |
| 5,868,835 A | * | 2/1999 | Nagai | ..................... C30B 15/02 117/18 |

(Continued)

FOREIGN PATENT DOCUMENTS

| | | |
|---|---|---|
| JP | S62-260791 A | 11/1987 |
| JP | H02-157180 A | 6/1990 |

(Continued)

OTHER PUBLICATIONS

Jan. 21, 2014 International Search Report issued in International Patent Application No. PCT/JP2013/006344.

(Continued)

*Primary Examiner* — Robert M Kunemund
(74) *Attorney, Agent, or Firm* — Oliff PLC

(57) ABSTRACT

A method of charging raw material, includes: storing the material in a recharge tube including a quartz cylinder for storing the material and a conical valve for opening or closing an opening at a lower end of the cylinder; installing the recharge tube storing the raw material in a chamber; and feeding the raw material stored in the recharge tube into the crucible by locating the recharge tube and crucible such that a distance between the lower end of the recharge tube and raw material or melt in the crucible ranges from 200 to 250 mm, and lowering the conical valve to open the opening while simultaneously lowering the crucible such that a ratio CL/SL of the lowering speed of the crucible to the lowering speed of the conical valve ranges from 1.3 to 1.45. The (Continued)

method can inhibit damage of the quartz crucible and recharge tube.

6 Claims, 3 Drawing Sheets

(56) References Cited

U.S. PATENT DOCUMENTS

| | | |
|---|---|---|
| 2004/0226504 A1 | 11/2004 | Nakashima et al. |
| 2006/0060133 A1 | 3/2006 | Nakashima et al. |
| 2011/0036860 A1* | 2/2011 | Fujiwara .................. C30B 15/02 117/213 |

FOREIGN PATENT DOCUMENTS

| | | |
|---|---|---|
| JP | 2005-001977 A | 1/2005 |
| JP | 2008-063205 A | 3/2008 |
| JP | 2008-285351 A | 11/2008 |
| JP | 2010-083685 A | 4/2010 |
| WO | 02/068732 A1 | 9/2002 |

OTHER PUBLICATIONS

May 26, 2015 International Preliminary Report on Patentability issud in International Patent Application No. PCT/JP2013/006344.
Sep. 15, 2015 Office Action issued in Japanese Patent Application No. 2012-254568.
Jul. 8, 2016 Office Action issued in Chinese Patent Application No. 201380048354.7.

* cited by examiner

D1: recharge tube inner diameter [mm]
L1: recharge tube length [mm]
V: capacity for raw material [m³]
D2: quartz crucible inner diameter [mm]
L2: estimated height of fed raw material [mm]
H: distance between recharge tube and melt [mm]
H = k×L2

FIG. 4
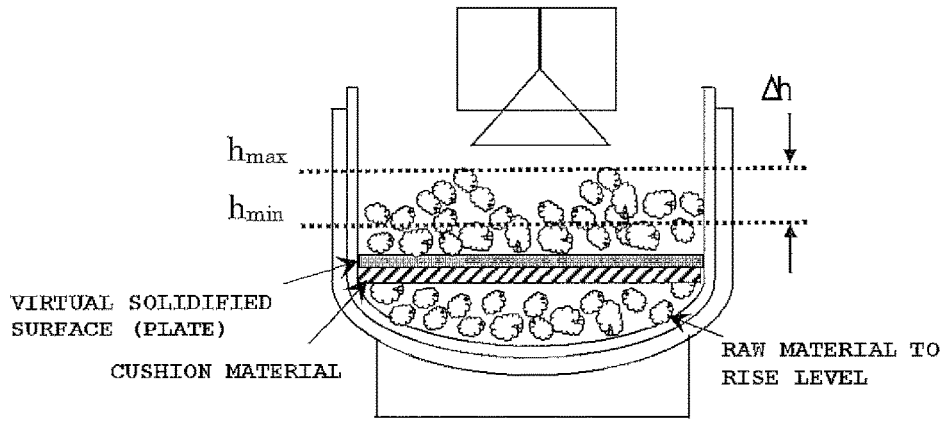
FIG. 5A
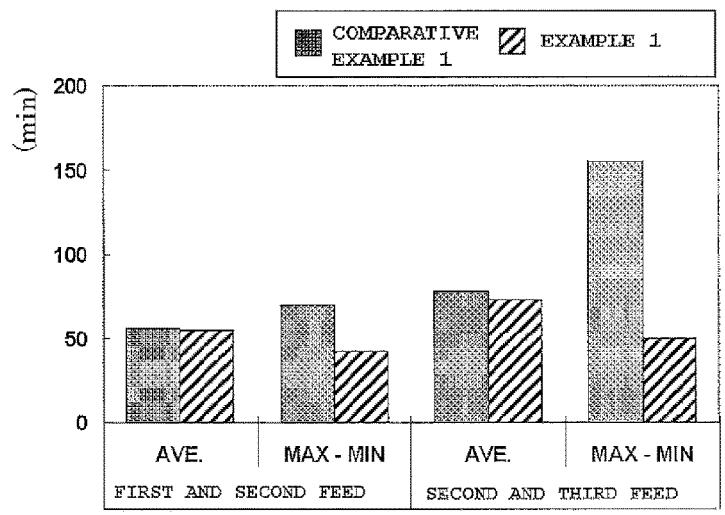
FIG. 5B
| CP (mm) | RECHARGE NUMBER | FIRST FEED | SECOND FEED | THIRD FEED |
|---|---|---|---|---|
| COMPARATIVE EXAMPLE 1 | AVE. | 258 | 374 | 437 |
| | MAX - MIN | 171 | 190 | 183 |
| EXAMPLE 1 | AVE. | 190 | 287 | 349 |
| | MAX - MIN | 14 | 44 | 54 |

METHOD OF CHARGING RAW MATERIAL, METHOD OF MANUFACTURING SINGLE CRYSTALS, AND SINGLE CRYSTAL MANUFACTURING APPARATUS

TECHNICAL FIELD

The present invention relates to a method of charging raw material to a quartz crucible with a recharge tube in a single-crystal manufacturing process.

BACKGROUND ART

Silicon single crystals, which are used as substrates of semiconductor integrated circuits, are typically manufactured by the Czochralski (CZ) method or the magnetic field applied Czochralski (MCZ) method. The CZ and MCZ methods involve charging a silicon raw material to a quartz crucible, melting the material into a melt, bringing a seed crystal into contact with the melt, and pulling the seed crystal to grow a silicon single crystal. In a single-crystal manufacturing apparatus (a pulling apparatus) according to the CZ or MCZ method, a heater to heat the melt is disposed in a main chamber, and the quartz crucible to receive the melt is disposed inside the heater.

The methods normally begin with charging of the raw material to the quartz crucible. The raw material is then melted by the heater. In recent years, enlarging the diameter and length of silicon single crystals may cause lack of the raw material initially charged to the quartz crucible, creating a need for adding the raw material. This is called additional charge. The additional charge is carried out by storing additional raw material in a recharge tube including a cone (a conical valve) at its lower end, and feeding the raw material into the quartz crucible from the recharge tube. After all the raw material is melted, growth of a silicon single crystal begins.

The quartz crucible is filled with the melt, into which the raw material is melted. The silicon single crystal is grown from the melt. The grown single crystal is pulled into a pull chamber that is connected to the upper part of the main chamber through a gate valve, and cooled there. The single crystal is then taken out of the pull chamber.

In single-crystal manufacture, if one single crystal is manufactured with a single quartz crucible, the growth of the single crystal is completed at this point of time. In this case, however, the production cost increases because the quartz crucible is broken at the end of the growth and therefore cannot be reused. A multiple operation that a plurality of single crystals grow by using a single quartz crucible may accordingly be carried out. In this operation, growing a single crystal reduces the melt in the quartz crucible by the amount corresponding to the grown crystal, thereby making it impossible to grow a next single crystal. The raw material is accordingly recharged to compensate for the reduction.

There have been proposed recharging methods such as a rod recharging method, and a method of recharging raw material from a container, as disclosed in Patent Document 1. The art disclosed in many patent documents involves storing the raw material in the recharge tube including the conical valve at its lower end, and feeding the raw material stored in the recharge tube into the quartz crucible. Patent Documents 2 and 3 disclose the foundation of this art.

Such a method feeds the raw material as follows: after a grown silicon crystal is taken out of the pull chamber with the gate valve closed, the recharge tube storing raw material is hanged by a wire and fixed. Air is evacuated from the pull chamber so that the pressure in the pull chamber is the same as in the main chamber. The gate valve is then opened to lower the recharge tube. The conical valve is lowered to open the opening of the recharge tube and thereby to feed the raw material.

Since broken chunks of polycrystalline silicon, although single crystal is rarely used, are normally used as the raw material to be charged, there are vacant spaces in the recharge tube storing the material. A single charging process by the recharge tube may accordingly be insufficient for additional raw material to grow a single crystal. In this case, the charging process is successively performed multiple times.

CITATION LIST

Patent Literature

Patent Document 1: Japanese Unexamined Patent publication (Kokai) No. S62-260791
Patent Document 2: Japanese Unexamined Patent publication (Kokai) No. H02-157180
Patent Document 3: International Publication No. WO2002/068732

SUMMARY OF INVENTION

Technical Problem

Patent Document 3 discloses a method of charging raw material by using a recharge tube having a body with a wider diameter toward its lower end, which includes raising a quartz crucible to bring the conical valve of this recharge tube into contact with the solidified surface of residual melt, reducing a load of a wire by which the recharge tube is hanged after the contact, and lowering the quartz crucible and hence the conical valve.

This method, however, may center the raw material without uniformly feeding the raw material, so the variation in height of non-melted raw material increases. The next charging process therefore needs to wait until the raw material fed by the previous charging process is somewhat melted, or even though all the raw material can be fed, it takes time to melt all the material. In any case, this method takes time to melt additional raw material.

When the raw material is charge, an operator operates the wire and the quartz crucible while checking the interior of a furnace. The wire and the quartz crucible are ideally operated simultaneously. It is however difficult for the operator to operate while checking both the wire and the quartz crucible. This problem is one factor that has prevented the optimal charge.

A common charging process accordingly includes increasing the distance between the quartz crucible and the conical valve depending on an expected descent of the conical valve, that is, sufficiently lowering the quartz crucible, before the charging begins. The raw material charged in this way however collides violently with and severely damages the quartz crucible. On the contrary, when the quartz crucible located higher at the beginning of charging, the following problem arises: since the distance between the quartz crucible and the recharge tube decreases, the conical valve contacts the fed raw material and thereby violently vibrates at the final stage of charging. As a result, the recharge tube, which is made of quartz, cracks or breaks, and a large difference in level is made on the upper side of the fed raw material, resulting in non-uniform melt.

The present invention was accomplished in view of the above-described problems. It is an object of the present invention to provide a method of charging raw material that can feed the raw material into a quartz crucible smoothly while inhibiting the quartz crucible and a recharge tube from breaking, and reduce the time required for melting.

Solution to Problem

To achieve this object, the present invention provides a method of charging raw material to a quartz crucible in a single-crystal manufacturing process including charging the raw material to the quartz crucible, melting the raw material into melt in the quartz crucible, and pulling a single crystal from the melt, comprising: storing the raw material in a recharge tube including a quartz cylinder configured to store the raw material and a conical valve configured to open or close an opening positioned at a lower end of the cylinder; installing the recharge tube storing the raw material in a chamber; and feeding the raw material stored in the recharge tube into the quartz crucible by locating the recharge tube and the quartz crucible such that a distance between the lower end of the recharge tube and raw material or melt in the quartz crucible ranges from 200 mm to 250 mm at the start of a raw-material feeding operation, and then lowering the conical valve to open the opening positioned at the lower end of the cylinder while simultaneously lowering the quartz crucible such that a ratio CL/SL ranges from 1.3 to 1.45, where CL is a lowering speed of the quartz crucible and SL is a lowering speed of the conical valve of the recharge tube.

Such a method can feed the raw material at a proper feed rate after locating the recharge tube and the quartz crucible at the respective proper positions, thereby enabling the inhibition of the damage of the quartz crucible due to a falling raw material and of the recharge tube due to contact with the fed raw material. The method also can make the height position on the upper side of the fed raw material substantially constant, thereby enabling the raw material to be efficiently melted.

The lowering speed SL of the conical valve of the recharge tube preferably ranges from 250 mm/min to 375 mm/min.

Lowering the conical valve at a lowering speed SL of 250 mm/min or more can inhibit an increase in feed time due to intermittent feeding of the raw material, thereby reliably enabling the raw material to be uniformly fed into the quartz crucible. The method can accordingly reduce the time required for melting the raw material and waiting time for the next charging process when the charging process is successively performed. Lowering the conical valve at a lowering speed SL of 375 mm/min or less can more reliably inhibit the quartz crucible from breaking due to a raw material violently fed.

Furthermore the present invention provides a method of manufacturing a plurality of single crystals by using a single quartz crucible, comprising repeating a process including: charging raw material to the quartz crucible by the inventive raw-material charging method; melting the raw material into a melt in the quartz crucible; and pulling a single crystal from the melt.

Such a method can inhibit the damage of the quartz crucible due to a falling raw material and of the recharge tube due to contact with the fed raw material when the raw material is charged. This method also can uniformly feed the raw material into the quartz crucible, thereby enabling reduction in the time required for melting the raw material and the waiting time for the next charging process when the charging process is successively performed, so the time required for manufacturing the single crystal can be reduced.

Furthermore the present invention provides a single-crystal manufacturing apparatus comprising: a recharge tube including a quartz cylinder configured to store raw material and a conical valve configured to open or close an opening positioned at a lower end of the cylinder; a quartz crucible configured to receive the raw material; a heater configured to melt the raw material into a melt; a chamber in which the quartz crucible and the heater are disposed, the chamber being capable of installing the recharge tube therein; and a control unit configured to automatically control location of the recharge tube and the quartz crucible at the start of a raw-material feeding operation and lowering of the quartz crucible and the conical valve of the recharge tube during the raw-material feeding operation, when the raw material is charged to the quartz crucible by the inventive raw-material charging method.

Such a single-crystal manufacturing apparatus can reliably control the recharge tube and the quartz crucible in a short time to charge the raw material for use in single-crystal manufacture, thereby enabling the above raw-material charging method to be reliably performed, and improving the productivity of single-crystal manufacture.

Advantageous Effects of Invention

The invention involves a process of charging raw material to a quartz crucible to manufacture a single crystal. This process includes keeping raw material or melt in the quartz crucible at a distance ranging between 200 mm and 250 mm from the lower end of a recharge tube right before the raw material is to be charged, and adjusting the lowering speed CL of the quartz crucible and the lowering speed SL of the conical valve of the recharge tube such that the ratio CL/SL ranges from 1.3 to 1.45. The invention can thereby feed the raw material at a proper feed rate after locating the recharge tube and the quartz crucible at the respective proper positions, thereby enabling the inhibition of the damage of the quartz crucible due to a falling raw material and the damage of the recharge tube due to contact of the recharge tube with the fed raw material. The invention also can reduce variation in operator's operation time and achieve a stable operation.

In addition, the conical valve whose lowering speed (SL) range lies between 250 mm and 375 mm reliably allows the raw material to be reliably fed uniformly into the quartz crucible. The invention can consequently reduce the time required for melting the raw material and the waiting time for the next charging process when the charging process is successively performed.

BRIEF DESCRIPTION OF DRAWINGS

FIG. 4 is a schematic diagram of quartz crucibles used in examples 1 and 2, and comparative examples 1 and 2; and FIG. 5 shows the result of example 1 and comparative example 1.

DESCRIPTION OF EMBODIMENTS

An embodiment of the present invention will be described in detail with reference to the figures, but the present invention is not limited to this embodiment.

The inventive single-crystal manufacturing apparatus will now be described.

Figure 1:
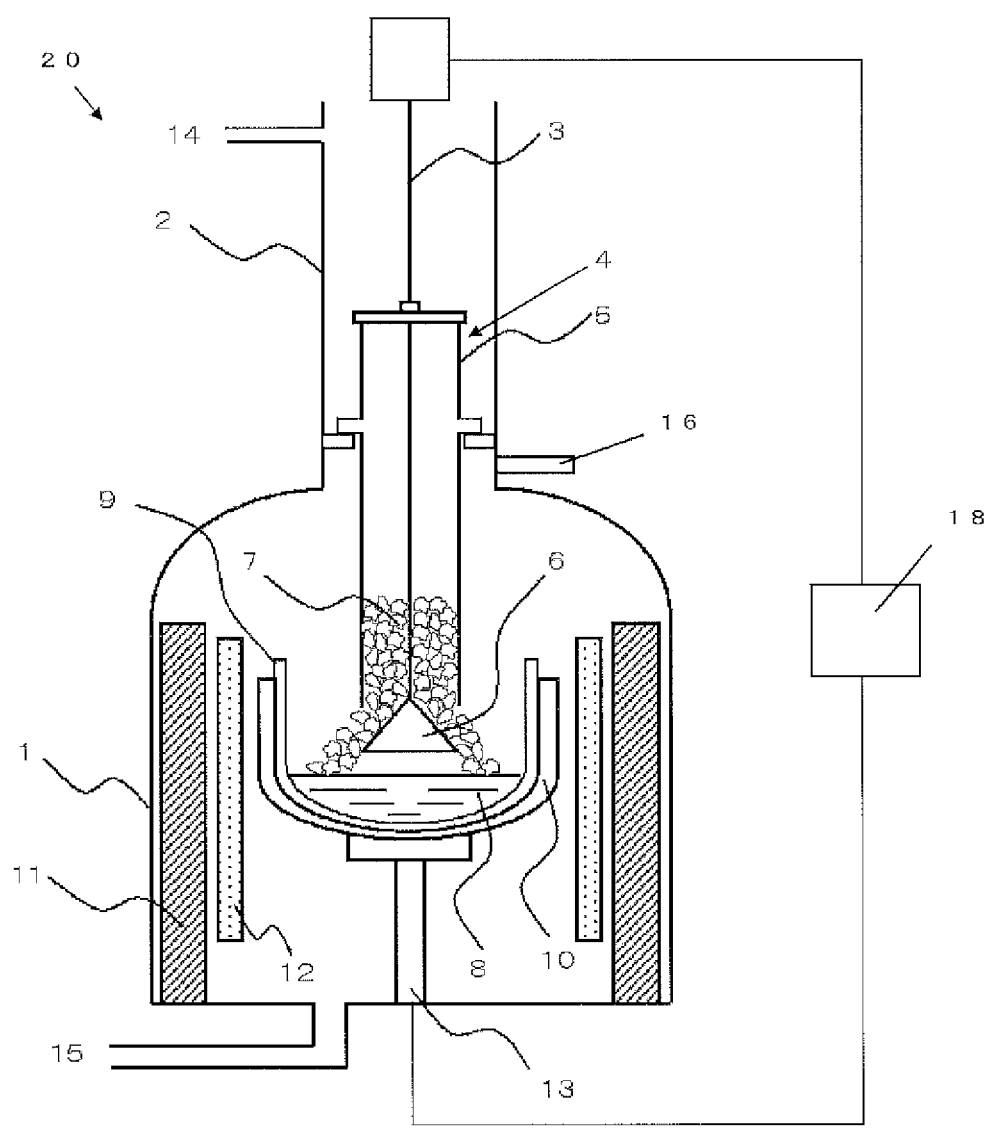
FIG. 1 is a schematic diagram of an example of the inventive single-crystal manufacturing apparatus.

As shown in FIG. 1, the single-crystal manufacturing apparatus 20 includes a main chamber 1, a quartz crucible 9 and a graphite crucible 10 configured to receive a melt 8 within the main chamber 1, a heater 12 disposed so as to surround the quartz crucible 9 and the graphite crucible 10, a heat insulator 11 surrounding the heater 12, a pull chamber 2 that is connected to the upper part of the main chamber 1 through a gate valve 16 and capable of storing a grown single crystal (single crystal ingot), and a recharge tube 4.

The pull chamber 2 is provided with a gas inlet 14 through which a gas to be circulated through the interior of a furnace passes. The main chamber 1 is provided, at its bottom, with a gas outlet 15 through which the circulated gas is discharged. The quartz crucible 9 and the graphite crucible 10 are disposed movably in the direction of crystal growth axis through a supporting shaft 13. During the growth of a crystal, the quartz crucible 9 and the graphite crucible 10 are raised to compensate the descent of the surface level of the melt 8 that is decreased by crystallization. This operation keeps the surface level of the melt 8 substantially constant.

Figure 2:
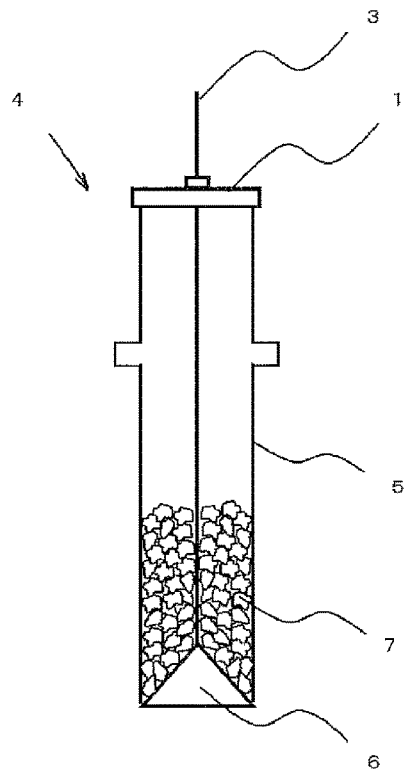
FIG. 2 is a schematic diagram of an exemplary recharge tube that can be used in the invention.

As shown in FIG. 2, the recharge tube 4 includes a quartz cylinder 5 configured to store raw material 7, which is polycrystal or single crystal, a conical valve 6 configured to open or close an opening positioned at the lower end of the cylinder 5, and a lid 17 attached to the upper end of the cylinder 5. As shown in FIG. 1, the raw material 7 stored in the recharge tube 4 can be fed into the quartz crucible 9 by lowering the conical valve 6 to open the opening, after the power of the heater 12 is decreased to solidify the surface of the melt 8 in the quartz crucible 9. The recharge tube 4 is installed in the pull chamber 2 with the recharge tube hanged by a wire 3 when the raw material is charged, and detached when a single crystal is manufactured after the raw material is charged. One end of the wire 3 is fixed to the conical valve 6 of the recharge tube 4. Feeding the wire 3 downward allows the conical valve 6 to descend.

The inventive single-crystal manufacturing apparatus 20 also includes a control unit 18 configured to automatically control the location of the recharge tube 4 and the quartz crucible 9 at the start of the feeding of the raw material 7 and the lowering speed of the quartz crucible 9 and the conical valve 6 of the recharge tube 4 during the feeding of the raw material 7, when the raw material is charged to the quartz crucible by the inventive raw-material charging method, as described below. The control unit 18 can reliably control the recharge tube 4 and the quartz crucible 9 in a short time, thereby enabling improvement in the productivity and reduction of labor. The apparatus may be provided with, for example, a laser measurement sensor or camera that detects the position of the fed raw material or the melt surface in the quartz crucible 9.

The inventive method of charging raw material and method of manufacturing single crystals will now be described. These embodiment described herein use the inventive single-crystal manufacturing apparatus 20 shown in FIG. 1.

The inventive single-crystals manufacturing method manufactures a plurality of single crystals by using a single quartz crucible and involves repeating a process including charging the raw material 7 to the quartz crucible 9, melting the raw material 7 into the melt 8 within the quartz crucible 9, and pulling a single crystal from the melt 8. The inventive raw-material charging method involves feeding the raw material 7 stored in the recharge tube 4 into the quartz crucible 9 when the raw material 7 is charged to the quartz crucible 9 in the inventive single-crystals manufacturing method.

In the inventive single-crystals manufacturing method, the raw material 7 is charged to the quartz crucible 9 according to the inventive raw-material charging method. As shown in FIG. 2, the raw material 7 is first stored in the recharge tube 4. As shown in FIG. 1, the recharge tube 4 storing the raw material 7 is then hanged by the wire 3 inside the pull chamber 2 and installed therein. The power of the heater 12 is decreased to solidify the surface of the melt 8 in the quartz crucible 9. The recharge tube 4 and the quartz crucible 9 are then located such that the distance between the lower end of the recharge tube 4 and the raw material or the melt 8 already present in the quartz crucible 9 ranges from 200 mm to 250 mm at the start of the feeding of the raw material 7. This adjustment of the distance can be made by moving the quartz crucible 9 vertically.

Figure 3:
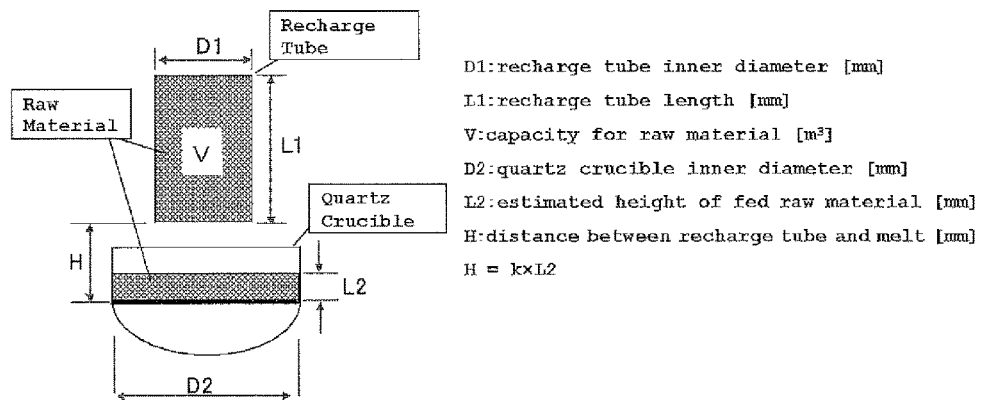
FIG. 3 is an explanatory view of an exemplary procedure for determining a distance between the lower end of a recharge tube and raw material or melt in a quartz crucible.

The above distance can be specifically determined in the range from 200 mm to 250 mm by the following expression (2):

$$V = (D1 \times 10^{-3})^2 \times \pi/4 \times (L1 \times 10^{-3}) \quad (1)$$

$$H = k \times L2 \quad (2)$$

$$L2 = V/((D2 \times 10^{-3})^2 \times \pi/4) \quad (3),$$

where D1 is the inner diameter (mm) of the recharge tube; L1 is the length (mm) of the recharge tube; V is the capacity (m³) for the raw material; H is the distance (mm); L2 is the estimated height (mm) of the fed raw material; and D2 is the inner diameter (mm) of the quartz crucible. These symbols are also shown in FIG. 3.

The value k is a constant given by a previous experiment etc. When a 800-mm-diameter quartz crucible is used, for example, the value k may be 1.42.

The conical valve 6 is then lowered to open the opening of the cylinder 5 so that the raw material 7 stored in the recharge tube 4 is fed into the quartz crucible 9. While the raw material 7 is fed, the quartz crucible 9 is lowered simultaneously with the recharge tube 4 such that the ratio CL/SL of the lowering speed CL of the quartz crucible 9 to the lowering speed SL of the conical valve 6 of the recharge tube 4 ranges from 1.3 to 1.45.

If all the raw material cannot be fed by a single feeding operation, then the feeding operation may be divided into multiple operations, in which the above raw-material charging method is performed multiple times.

In this manner, the inventive method of charging raw material begins feeding after locating the recharge tube and the quartz crucible at the proper positions, thereby enabling the inhibition of the damage of the quartz crucible and the recharge tube. In contrast, if the position of the quartz crucible is too low, then the raw material is thrown out, and violently falls on the quartz crucible, so the quartz crucible can be damaged; if the position of the quartz crucible is too high, then the conical valve contacts the fed raw material, so the recharge tube can be damaged. The inventive method adjusts both the lowering speed CL of the quartz crucible so as to be faster than the lowering speed SL of the conical valve and the ratio CL/SL within the range from 1.3 to 1.45. In this way, the quartz crucible can be located lower as the amount of the fed raw material increases, and the above damage of the quartz crucible and the recharge tube can thus be reliably inhibited.

In addition, the inventive method of charging raw material can eliminate the variation in operator's operation, which conventionally occurs, and hence reduce the variation in operation time, so a stable raw-material charging process can be expected. This stable charging enables automation of a series of processes: installing the recharge tube in the pull chamber; opening the gate valve; charging the raw material; pulling up the recharge tube into the interior of the pull chamber; closing the gate valve; and increasing the pressure in the pull chamber to normal pressure. The control unit 18 can control these processes.

The lowering speed SL of the conical valve of the recharge tube at the start of the feeding of the raw material preferably ranges from 250 mm/min to 375 mm/min.

Lowering the conical valve at a lowering speed SL of 250 mm/min or more can inhibit the increase in feed time, which is caused by the raw material being intermittently fed, thereby reliably enabling the raw material to be uniformly fed into the quartz crucible. The method can accordingly reduce the melting time for the raw material and the waiting time for the next charging process when the charging process is successively performed. Lowering the conical valve at a lowering speed SL of 375 mm/min or less can more reliably inhibit the damage of the quartz crucible, which is caused by the raw material being violently fed.

After the raw material is charged, the raw material 7 in the quartz crucible 9 is melted into the melt 8 by the heater 12. A seed crystal (not shown) is then brought into contact with the melt 8 and pulled to grow a single crystal. After the charging is again performed by the inventive raw-material charging method, a single crystal is pulled with the same quartz crucible. These processes are repeated to manufacture a plurality of single crystals.

In this manner, the inventive method of manufacturing single crystals can uniformly feed the raw material into the quartz crucible while inhibiting the damage of the quartz crucible due to a falling raw material and the damage of the recharge tube due to the contact of the recharge tube with the fed raw material when the raw material is charged. This method can consequently reduce the melting time for the raw material and the waiting time for the next charging process when the charging process is successively performed, thereby reducing the manufacturing time for the single crystal.

EXAMPLE

The present invention will be more specifically described below with reference to examples and comparative examples, but the present invention is not limited to these examples.

Example 1

The inventive single-crystal manufacturing apparatus, as shown in FIG. 1, was used to charge 75 kg of raw material to the quartz crucible according to the inventive raw-material charging method. How the fed raw material fell and whether the raw material was uniformly fed were evaluated. The quartz crucible used had a diameter of 800 mm (32 inches). As shown in FIG. 4, raw material to rise a level, a cushion material, a plate were placed in this order in the quartz crucible to create a virtual solidified surface. The feeding of the raw material was started when the quartz crucible was cold. The frequency at which the fed raw material collided with the quartz crucible and the contact of the recharge tube with the fed raw material were checked by a video made by a camera to evaluate how the fed raw material fell. As shown in FIG. 4, the difference Δh between the maximum $h_{max}$ and the minimum $h_{min}$ of the height of the fed raw material from the virtual solidified surface was measured with a depth gauge to evaluate whether the raw material was uniformly fed.

The raw-material feeding conditions were as follows:

The distance H between the lower end of the recharge tube and the virtual solidified surface in the quartz crucible at the start of the feeding was 200 mm, or 250 mm;

The lowering speed CL of the quartz crucible was 362.5 mm/min;

The lowering speed SL of the conical valve was 250 mm/min; and

The ratio CL/SL was 1.45.

The position of the virtual solidified surface was changed to three levels such that each virtual solidified surface corresponded to one when (A) the amount of the melt was low, (B) the amount of the melt was moderate, or (C) the amount of the melt was high.

The result of the state of the falling raw material is given in Table 1. In Table 1, the symbol O in the falling state means that the raw material and the quartz crucible collided a few times, and the recharge tube did not contact the raw material; the symbol Δ means that the raw material collided with the quartz crucible, or the recharge tube contacted the raw material a few times; the symbol x means that the raw material and the quartz crucible collided many times, and/or the recharge tube contacted the raw material many times.

As shown in Table 1, example 1 demonstrated that, in all cases, the state of the falling raw material was excellent, the number of the collision between the quartz crucible and the raw material was inhibited to a lower level, and the recharge tube was prevented from contacting the raw material. In addition, the difference Δh between the maximum and the minimum of the height of the fed raw material from the virtual solidified surface was also inhibited to a lower level. The raw material was uniformly fed.

In contrast, comparative example 1, described below, demonstrated that the state of the falling raw material was worse than that in example 1, the number of the collision between the quartz crucible and the raw material and the contact of the recharge tube with the raw material were larger than that in example 1.

In addition to the above evaluation, a total of 225 kg of raw material was charged by three feeding operations, each of which charged 75 kg of the raw material, under the conditions: the distance H was 200 mm. The time elapsed from the start of the feeding of the divided raw material to the end thereof mas measured in each operation. This was repeated 46 times to evaluate the average of the elapsed time and the difference between the maximum and the minimum thereof. The result is given in FIG. 5A. As shown in FIG. 5A, example 1 demonstrated that the variation in feed time was reduced. It can be said from this result that the raw material was stably fed uniformly, and the reproducibility of this uniform charging of the raw material was high. In contrast, comparative example 1, described below, demonstrated that the variation in feed time was gradually increased. FIG. 5B shows the result of the average and the difference between the maximum and the minimum of the height position CP of the quartz crucible at the start of the feeding. As shown in FIG. 5B, the variation in the height position CP of the quartz crucible in example 1 was smaller than that in comparative example 1.

Example 2

Raw material was fed under the same conditions to make the same evaluation as in example 1 except for the following feeding conditions:

The distance H between the lower end of the recharge tube and the virtual solidified surface in the quartz crucible at the start of the feeding was 200 mm;

The lowering speed SL of the conical valve was 125 mm/min, 250 mm/min, or 375 mm/min; and The ratio CL/SL was 1.3, or 1.45.

It is to be noted that example 1 exhibited the best result when the distance H was 200 mm.

The result of the state of the falling raw material is given in Table 2. As shown in Table 2, example 2 demonstrated that, in all cases, the state of the falling raw material was excellent, the number of the collision between the quartz crucible and the raw material was inhibited to a lower level, and the recharge tube was prevented from contacting the raw material. In addition, the difference Δh was also inhibited to a lower level in both cases where the lowering speed of the conical valve was 250 mm/min, or 375 mm/min. The raw material was uniformly fed.

In contrast, comparative example 2, described below, demonstrated that the state of the falling raw material was worse than that in example 2, the number of the collision between the quartz crucible and the raw material and the contact of the recharge tube with the raw material were larger than that in example 2.

Comparative Example 1

Raw material was fed under the same conditions to make the same evaluation as in example 1 except for the following feeding conditions:

The distance H between the lower end of the recharge tube and the virtual solidified surface in the quartz crucible at the start of the feeding was 150 mm, 300 mm, or 350 mm.

The result of the state of the falling raw material is given in Table 1. As shown in Table 1, when the distance H was 150 mm, the conical valve was placed on the fed raw material at the final stage of the feeding, and although the recharge tube did not break, the feeding operation was not completed because all the raw material did not fed out from the recharge tube; when the distance H was 300 mm, or 350 mm, the raw material was flown away, just like being thrown out, and violently collided with the quartz crucible. This is undesirable because if the quartz crucible was severely damaged, the melt may be leaked out in the worst case.

In addition to the above evaluation, a total of 225 kg of raw material was charged by three feeding operations, each of which charged 75 kg of the raw material as in example 1 except that the distance was 300 mm. The time elapsed from the start of the feeding of the divided raw material to the end thereof mas measured in each operation. This was repeated 93 times to evaluate the average of the elapsed time and the difference between the maximum and the minimum thereof. As shown in FIGS. 5A and 5B, the result was that both the variation in feed time and the variation in the height position CP of the quartz crucible were larger than those in example 1.

Comparative Example 2

Raw material was fed under the same conditions to make the same evaluation as in example 2 except for the following feeding conditions:

The ratio CL/SL was 1.0, 1.15, 1.60, 1.75, or 1.90.

When the ratio CL/SL was 1.0, the conical valve contacted the raw material at the final stage of the feeding, and the raw material was not uniformly fed; when the ratio CL/SL was 1.6 or more, although the raw material was uniformly fed, the number of the collision between the raw material and the quartz crucible was increased. The reason is that even though the recharge tube and the quartz crucible were located at the respective proper positions at the start of the feeding, the distance between the quartz crucible and the conical valve was gradually increased, so the feeding of the raw material was just like being thrown out.

TABLE 1

| SOLIDIFIED SURFACE POSITION | | COMPARATIVE EXAMPLE 1 | EXAMPLE 1 H(mm) | | COMPARATIVE EXAMPLE 1 |
| --- | --- | --- | --- | --- | --- |
| | | 150 | 200 | 250 | 300 | 350 |
| A (MELT, LOW) | FALLING STATE | Δ | ○ | ○ | Δ | x |
| | Δh (mm) | 150 | 110 | 115 | 140 | 130 |
| B (MELT, MODERATE) | FALLING STATE | Δ | ○ | ○ | Δ | x |
| | Δh (mm) | 120 | 100 | 130 | 150 | 130 |
| C (MELT, HIGH) | FALLING STATE | Δ | ○ | ○ | Δ | x |
| | Δh (mm) | 150 | 100 | 120 | 150 | 130 |

TABLE 2

| | | COMPARATIVE EXAMPLE 2 | EXAMPLE 2 CL/SL | | | | COMPARATIVE EXAMPLE 2 |
| --- | --- | --- | --- | --- | --- | --- | --- |
| SL (mm/min) | | 1.00 | 1.15 | 1.30 | 1.45 | 1.60 | 1.75 | 1.90 |
| 125 | FALLING STATE | x | Δ | ○ | ○ | Δ | Δ | x |
| | Δh (mm) | 190 | 180 | 120 | 110 | 165 | 150 | 150 |
| 250 | FALLING STATE | Δ | Δ | ○ | ○ | Δ | Δ | x |
| | Δh (mm) | 175 | 160 | 120 | 100 | 110 | 120 | 115 |
| 375 | FALLING STATE | Δ | Δ | ○ | ○ | Δ | Δ | x |
| | Δh (mm) | 180 | 165 | 100 | 110 | 110 | 115 | 120 |

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method of charging raw material to a quartz crucible in a single-crystal manufacturing process including charging the raw material to the quartz crucible, melting the raw material into melt in the quartz crucible, and pulling a single crystal from the melt, comprising:

storing the raw material in a recharge tube including a quartz cylinder configured to store the raw material and a conical valve configured to open or close an opening positioned at a lower end of the cylinder;

installing the recharge tube storing the raw material in a chamber; and feeding the raw material stored in the recharge tube into the quartz crucible by locating the recharge tube and the quartz crucible such that a distance between the lower end of the recharge tube and raw material or melt in the quartz crucible ranges from 200 mm to 250 mm at the start of a raw-material feeding operation, and then lowering the conical valve to open the opening positioned at the lower end of the cylinder while simultaneously lowering the quartz crucible such that a ratio CL/SL ranges from 1.3 to 1.45, where CL is a lowering speed of the quartz crucible and SL is a lowering speed of the conical valve of the recharge tube.

2. The method of charging raw material according to claim 1, wherein the lowering speed SL of the conical valve of the recharge tube ranges from 250 mm/min to 375 mm/min.

3. A method of manufacturing a plurality of single crystals by using a single quartz crucible, comprising repeating a process including: charging raw material to the quartz crucible by the method according to claim 1; melting the raw material into a melt in the quartz crucible; and pulling a single crystal from the melt.

4. A method of manufacturing a plurality of single crystals by using a single quartz crucible, comprising repeating a process including: charging raw material to the quartz crucible by the method according to claim 2; melting the raw material into a melt in the quartz crucible; and pulling a single crystal from the melt.

5. A single-crystal manufacturing apparatus comprising:

a recharge tube including a quartz cylinder configured to store raw material and a conical valve configured to open or close an opening positioned at a lower end of the cylinder;

a quartz crucible configured to receive the raw material;

a heater configured to melt the raw material into a melt;

a chamber in which the quartz crucible and the heater are disposed, the chamber being capable of installing the recharge tube therein; and a control unit configured to automatically control location of the recharge tube and the quartz crucible at the start of a raw-material feeding operation and lowering of the quartz crucible and the conical valve of the recharge tube during the raw-material feeding operation, when the raw material is charged to the quartz crucible by the method according to claim 1.

6. A single-crystal manufacturing apparatus comprising:

a recharge tube including a quartz cylinder configured to store raw material and a conical valve configured to open or close an opening positioned at a lower end of the cylinder;

a quartz crucible configured to receive the raw material;

a heater configured to melt the raw material into a melt;

a chamber in which the quartz crucible and the heater are disposed, the chamber being capable of installing the recharge tube therein; and a control unit configured to automatically control location of the recharge tube and the quartz crucible at the start of a raw-material feeding operation and lowering of the quartz crucible and the conical valve of the recharge tube during the raw-material feeding operation, when the raw material is charged to the quartz crucible by the method according to claim 2.

* * * * *